(12) United States Patent
Cui et al.

(10) Patent No.: US 11,894,343 B2
(45) Date of Patent: Feb. 6, 2024

(54) VERTICAL SEMICONDUCTOR DEVICE WITH SIDE GROOVES

(71) Applicant: WESTERN DIGITAL TECHNOLOGIES, INC., San Jose, CA (US)

(72) Inventors: Xianlu Cui, Shanghai (CN); Junrong Yan, Shanghai (CN); Wei Liu, Shanghai (CN); Zhonghua Qian, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 31 days.

(21) Appl. No.: 17/328,013

(22) Filed: May 24, 2021

(65) Prior Publication Data
US 2022/0375899 A1 Nov. 24, 2022

(51) Int. Cl.
| | |
|---|---|
| *H01L 25/065* | (2023.01) |
| *H01L 23/00* | (2006.01) |
| *H01L 23/498* | (2006.01) |
| *H01L 23/538* | (2006.01) |

(52) U.S. Cl.
CPC .... *H01L 25/0657* (2013.01); *H01L 23/49816* (2013.01); *H01L 23/49838* (2013.01); *H01L 23/5386* (2013.01); *H01L 24/13* (2013.01); *H01L 24/16* (2013.01); *H01L 24/73* (2013.01); *H01L 25/0655* (2013.01); *H01L 2224/13147* (2013.01); *H01L 2224/1623* (2013.01); *H01L 2224/16147* (2013.01); *H01L 2224/73204* (2013.01); *H01L 2225/06513* (2013.01); *H01L 2225/06517* (2013.01); *H01L 2225/06541* (2013.01); *H01L 2924/1438* (2013.01); *H01L 2924/182* (2013.01); *H01L 2924/1815* (2013.01)

(58) Field of Classification Search
None
See application file for complete search history.

(56) References Cited

U.S. PATENT DOCUMENTS

| | | | | |
|---|---|---|---|---|
| 10,325,881 | B2 * | 6/2019 | Upadhyayula | .......... H01L 24/16 |
| 10,490,529 | B2 * | 11/2019 | Chiu | ..................... H01L 21/568 |
| 11,094,674 | B2 * | 8/2021 | Vodrahalli | ............. H01L 24/08 |
| 11,222,865 | B2 * | 1/2022 | Periyannan | ............. H01L 24/48 |
| 2012/0051695 | A1 * | 3/2012 | Harada | ............... H01L 25/0657 |
| | | | | 385/39 |
| 2018/0342482 | A1 * | 11/2018 | Yu | ....................... H01L 21/6835 |

FOREIGN PATENT DOCUMENTS

| | | |
|---|---|---|
| KR | 20150009386 A | 1/2015 |
| KR | 20180018304 A | 2/2018 |

* cited by examiner

*Primary Examiner* — Long Pham
(74) *Attorney, Agent, or Firm* — Vierra Magen Marcus LLP

(57) ABSTRACT

A semiconductor device is vertically mounted on a medium such as a printed circuit board (PCB). The semiconductor device comprises a block of semiconductor dies, mounted in a vertical stack without offset. Once formed and encapsulated, side grooves may be formed in the device exposing electrical conductors of each die within the device. The electrical conductors exposed in the grooves mount to electrical contacts on the medium to electrically couple the semiconductor device to the medium.

17 Claims, 10 Drawing Sheets

US 11,894,343 B2

VERTICAL SEMICONDUCTOR DEVICE WITH SIDE GROOVES

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid-state drives.

While many varied packaging configurations are known, flash memory storage cards may in general be assembled as system-in-a-package (SiP) or multichip modules (MCM), where a plurality of die are mounted and interconnected on a small footprint substrate. The substrate may in general include a rigid, dielectric base having a conductive layer etched on one or both sides. Bond wires are typically formed between the dies and between the dies and the substrate to electrically connect the dies to each other and the substrate. Once electrical connections between the die and substrate are made, the assembly is then typically encased in a molding compound which provides a protective package.

In order to form the bond wires, the dies must be offset from each other to provide access to the die bond pads on all dies in the stack. This offset adds to the overall footprint length of the die stack. With the ever-present drive to provide more storage capacity, the number of dies in a package are increasing, but the overall footprint length of the die stack has become a limiting factor in the number of dies that can be wire bonded into a semiconductor package of standard size.

DETAILED DESCRIPTION

Figure 1:
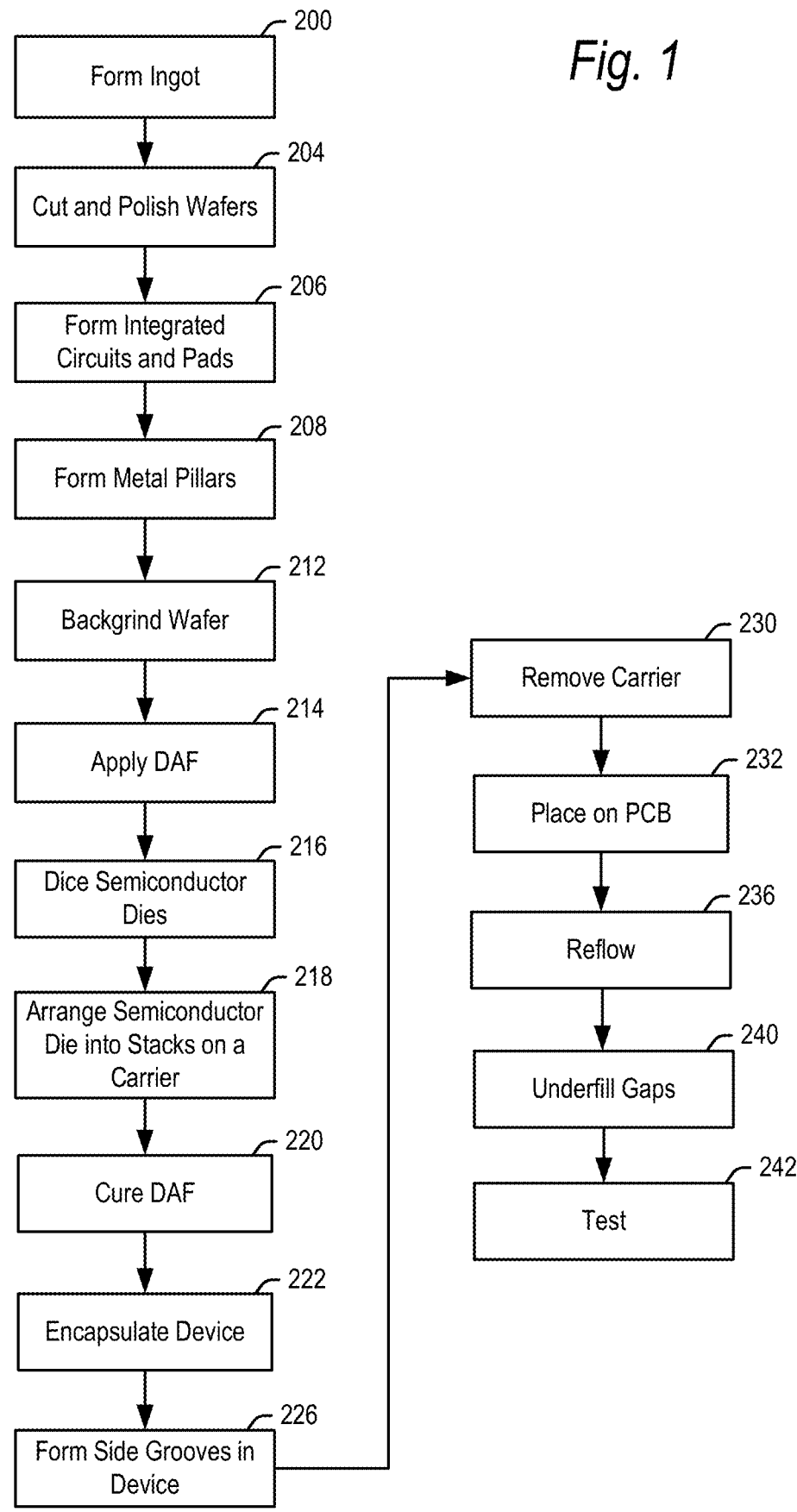
FIG. 1 is a flowchart for forming a semiconductor die according to embodiments of the present technology.

The present technology will now be described with reference to the figures, which in embodiments, relate to a semiconductor device vertically mounted on a medium such as a printed circuit board (PCB). The semiconductor device comprises a block of semiconductor dies, mounted in a vertical stack without offset. Once formed and encapsulated, side grooves may be formed in the device exposing electrical conductors of each die within the device. The electrical conductors may be copper pillars extending from surfaces of the semiconductor dies within the device. The semiconductor device may be mounted on a PCB so that the exposed electrical contacts of each die are electrically coupled to the PCB. This configuration provides an optimal, high density arrangement of semiconductor dies in the device, where a large number of semiconductor dies can be mounted and electrically coupled directly to the PCT, without a substrate, without offsetting the semiconductor dies, and without using wire bonds.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5%.

For purposes of this disclosure, a connection may be a direct connection or an indirect connection (e.g., via one or more other parts). In some cases, when a first element is referred to as being connected, affixed or coupled to a second element, the first and second elements may be directly connected, affixed or coupled to each other or indirectly connected, affixed or coupled to each other. When a first element is referred to as being directly connected, affixed or coupled to a second element, then there are no intervening elements between the first and second elements (other than possibly an adhesive or melted metal used to connect, affix or couple the first and second elements).

An embodiment of the present invention will now be explained with reference to the flowchart of FIG. 1, and the views of FIGS. 2-11. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

Figure 2:
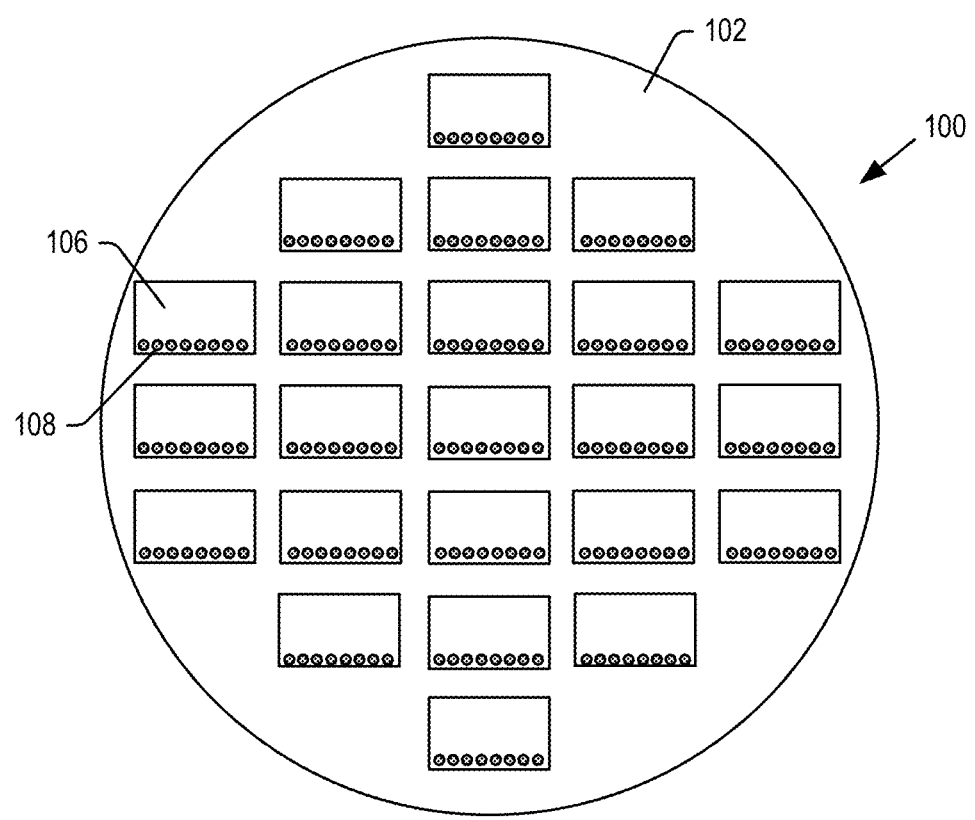
FIG. 2 is a front view of a semiconductor wafer showing a first major surface of the wafer.
Figure 3:
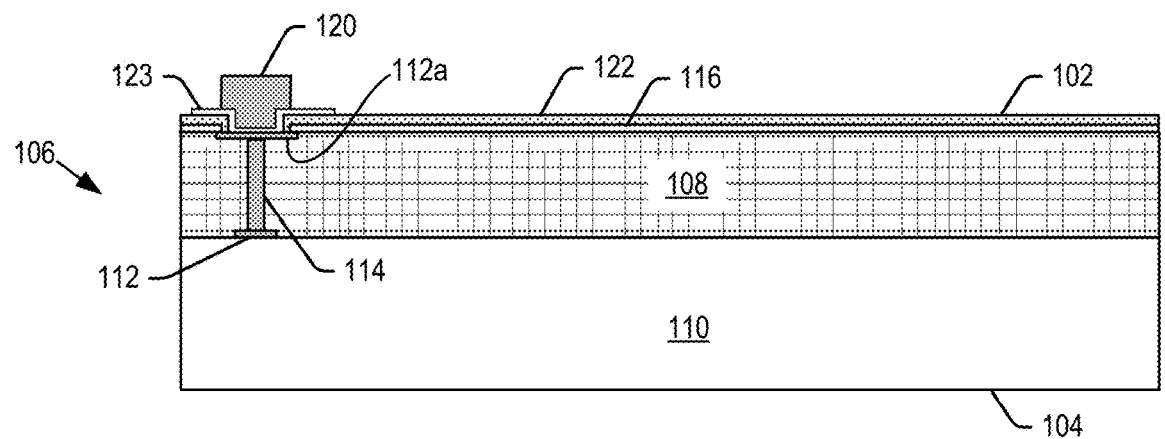
FIG. 3 is a cross-sectional view of a single semiconductor die from the wafer shown in FIG. 2.
Figure 4:
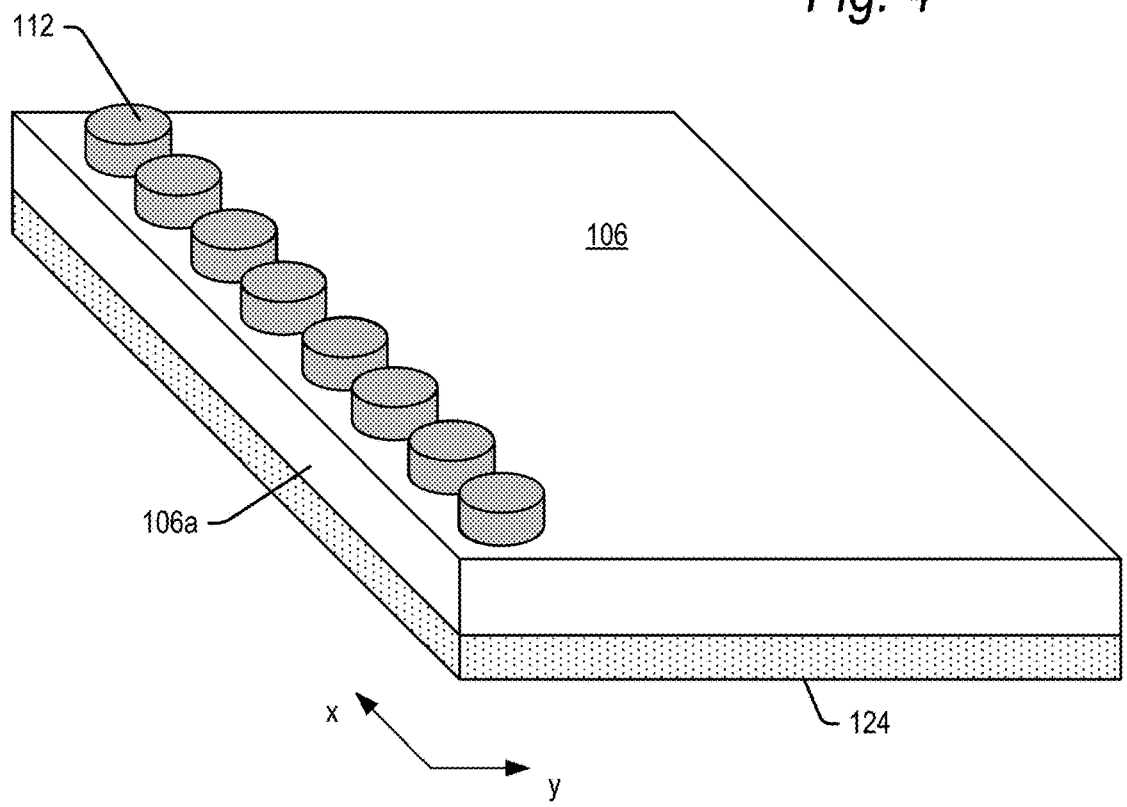
FIG. 4 is a perspective view of a single semiconductor die from the wafer shown in FIG. 2.

In step 204, the semiconductor wafer 100 may be cut from an ingot and polished on both the first major surface 102 (FIG. 2), and second major surface 104 (FIG. 3) opposite surface 102, to provide smooth surfaces. In step 206, the first major surface 102 may undergo various processing steps to divide the wafer 100 into a group of semiconductor dies 106 (FIGS. 2-4). The semiconductor dies 106 may be formed of integrated circuits 108 formed in the first major surface 102 over a substrate 110. Metallization layers formed of metal interconnects 112 and vias 114 may be formed in the dies 106 to electrically couple the integrated circuits 108 with metal pillars 120 on the first major surface 102 as explained below. The number and pattern of interconnects 112 and vias 114 are shown by way of example only and may vary in further embodiments. The first major surface 102 may be coated with a passivation layer 116 of dielectric material.

As noted, metal pillars 120 may be formed in step 208 extending from the first major surface 102. The pillars 120 are electrical conductors that protrude from the first major surfaces of the semiconductor dies 106. In embodiments, there may be a single row of metal pillars 120, though there may be other patterns and numbers of metal pillars in further embodiments. The metal pillars 120 may for example be formed of Copper, optionally capped with a compound such as Tin Silver (SnAg) to enhance the bonding ability of the metal pillars 120 to a PCB as explained below.

The metal pillars 120 may be formed on top of upper metal interconnect pads 112a by etching the passivation layer 116 to expose the pads 112a. A dielectric polyimide layer 122 may be applied over the passivation layer 116, leaving the upper metal interconnect pads 112a exposed. A UBM (under bump metal) layer 123 may next be sputtered onto pads 112a. The UBM layer 123 may be Nickel, Tin, Copper or the like. A photoresist layer (not shown) may then be applied over polyimide layer 122, and developed to remove portions of the photoresist to form recesses over the UBM layers 123. Thereafter, the metal pillars 120 may be formed in the recesses on top of the UBM layers 123 by plating or other deposition techniques. The photoresist may then be stripped and portions of the UBM layer not covered by the metal pillars may be etched away. The metal pillars 120 may lastly be heated to reflow the pillars and fix them to the first major planar surface 102.

In embodiments, the metal pillars 120 may have circular cross-sections, though the pillars may have square, rectangular or other cross-sections in further embodiments. The metal pillars 120 may be formed of materials other than copper, and formed by other processes in further embodiments. The metal pillars 120 may for example extend 5 microns (µm) to 70 µm above the first major surface 102, and have a diameter of 20 µm to 70 µm, though the pillars 120 may have heights and diameters that are greater or lesser than these ranges in further embodiments. In embodiments, the pillars 120 may be slightly spaced inward from a front edge 106a (FIG. 4) of semiconductor die 106. In further embodiments, the pillars may be formed closer to or at edge 106a. Edge 106a may be formed perpendicularly to the major surfaces of dies 106, or at some other nonzero angle.

In step 212, the wafer 100 may undergo a backgrind process against the second major surface 104 to thin the wafer from, for example, about 775 microns (µm) to a range of about 25 µm to 50 µm. It is understood that the wafer 100 may be thinner or thicker than this range after the backgrind step in further embodiments.

In a step 214, the wafer may be supported on its first major surface 102, and a layer of die attach film (DAF) 124 may be applied to the second major surface 104 of wafer 100 as shown for example in FIG. 4. As one example, the DAF 124 may be 8988UV epoxy from Henkel Corp., having offices in California, USA. DAF 124 may be applied as a B-stage adhesive. In such a state, the metal pillars are able to embed into the DAF 124 when the dies 106 are stacked as explained below. The DAF 124 may have a thickness of 5 µm to 70 µm, though it may be thinner or thicker than that in further embodiments. In embodiments, the DAF 124 on the second major surface 104 may be at least as thick as the height of pillars 120 on the first major surface 102.

The semiconductor dies 106 may next be diced from the wafer 100 in step 216. The wafer 100 may be diced by any of a variety of dicing techniques, including sawing, lasing or stealth lasing before grind processes. In embodiments, the diced dies 106 may be flash memory dies, such as for example 2D NAND flash memory or 3D BiCS (Bit Cost Scaling), V-NAND or other 3D flash memory. Other types of dies are possible for dies 106.

A plurality of wafers 100 may be fabricated according to steps 200-216 explained above. Thereafter, a pick and place robot may take semiconductor dies 106 from the same wafer or different wafers and stack them into a die stack 130 of semiconductor dies 106 in step 218 as shown in the cross-sectional edge view of FIG. 5. The die stack 130 may form a semiconductor device 150. The dies 106 may be stacked horizontally into the device 150. That is, the DAF 124 of a first die may be supported on a horizontal, x-y plane of a carrier 132, and the rest of the dies 106 in the stack 130 may be stacked horizontally upwards thereon in the z-direction, without an offset, to form a block of semiconductor dies.

Figure 5:
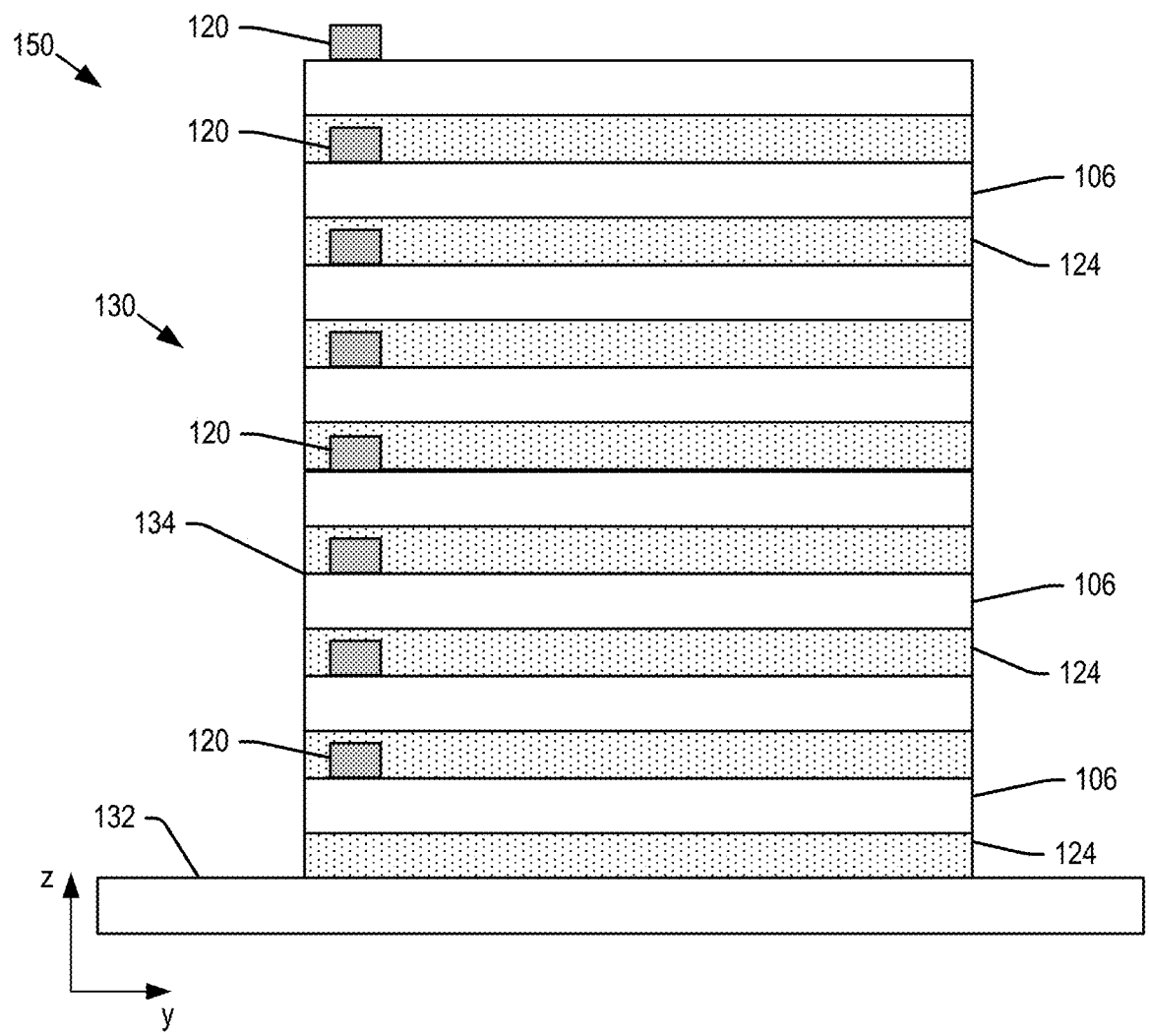
FIG. 5 is a cross-sectional edge view of a stack of semiconductor dies diced from the wafer according to embodiments of the present technology.

Each semiconductor die 106 in the semiconductor device 150 may be separated from each other by the thickness of the DAF 124 as shown in FIG. 5. As noted above, the DAF 124 is a B-stage adhesive at this point, so that the metal pillars 120 of one semiconductor die 106 bury within the DAF 124 of the next adjacent (next upper adjacent) semiconductor die. Thus, the DAF 124 of the next upper adjacent semiconductor die lies flat against the next lower adjacent semiconductor die 106. Once arranged on the carrier 132 with the metal pillars embedded in the DAF layers, the dies 106 in the stack may be heated (step 220) to cure the DAF 124 from a B-stage to a solid C-stage.

The number of semiconductor dies 106 in a single semiconductor device 150 may vary in embodiments, including for example 2, 4, 8, 16, 32, 64 or 128 semiconductor dies. There may be more or other numbers of semiconductor dies in a semiconductor device 150 in further embodiments.

The dies 106 are stacked so that the front edges 106a (FIG. 4) of each die align with each other to define a planar reference surface 134 (FIG. 5) in stack 130, residing in the x-z plane in FIG. 5. (It is understood that the x-y-z axes shown in figures are used consistently throughout the figures for ease of understanding, but the dies 106 and stack 130 may reside in other planes in further embodiments). The metal pillars 120 are buried within and adjacent to the reference surface 134 in the x-z plane of FIG. 5. As noted, FIG. 5 is a cross-sectional view taken through a y-z plane.

Figure 6:
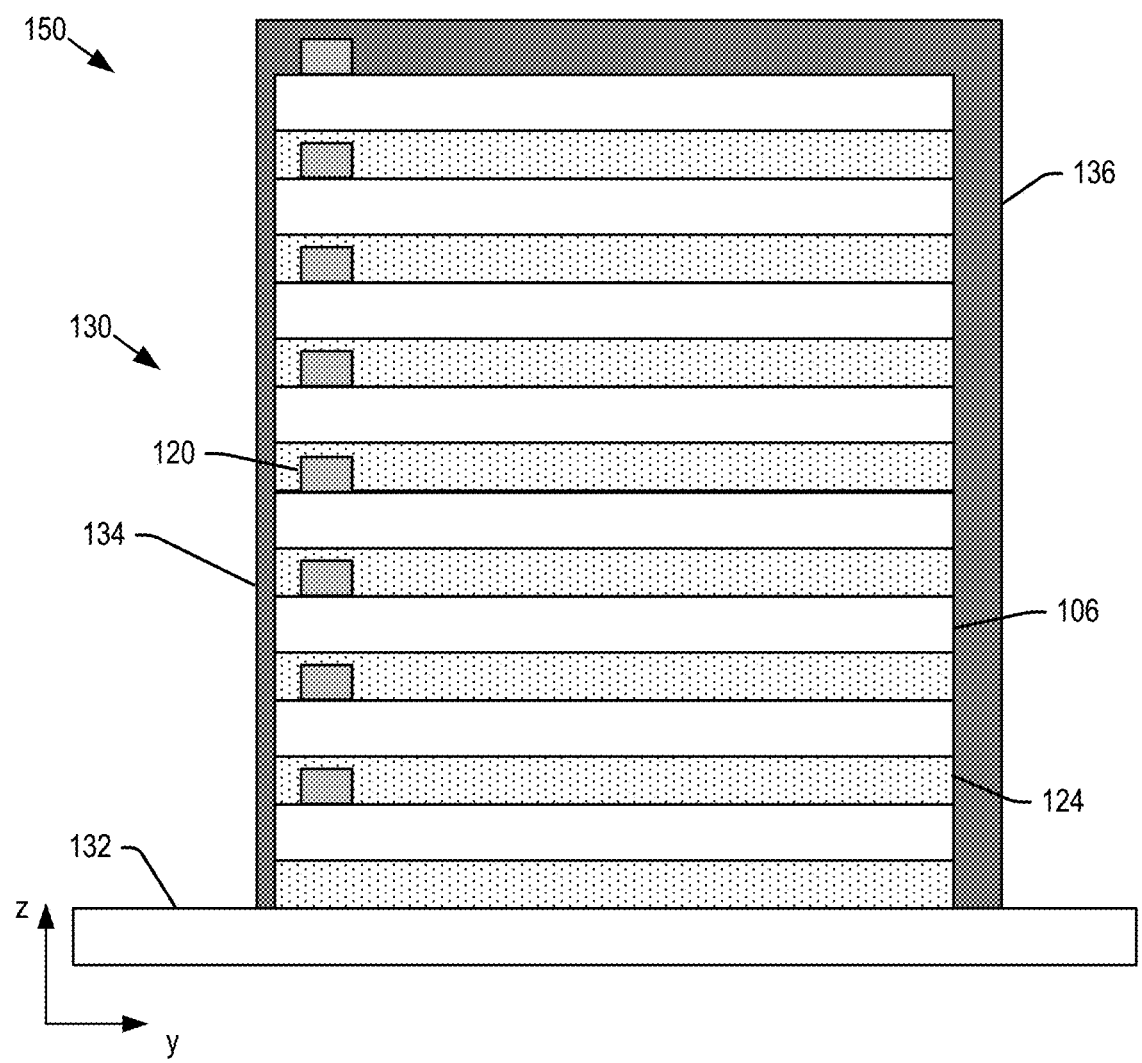
FIG. 6 is a cross-sectional edge view of a stack of encapsulated semiconductor dies according to embodiments of the present technology.

Once the desired number of dies 106 are stacked on carrier 132, the die stack 130 may be encapsulated in a mold compound 136 in a step 222 and as shown in the cross-sectional view of FIG. 6. The mold compound 136 covers all of the semiconductor dies 106, and solder pillars 120, including the solder pillars 120 on the upper-most semiconductor die 106 in stack 130 that are not buried in DAF 124. Mold compound 136 may include for example solid epoxy resin, Phenol resin, fused silica, crystalline silica, carbon black and/or metal hydroxide. Other mold compounds from other manufacturers are contemplated. The mold compound may be applied by various known processes, including by compression molding, FFT (flow free thin) molding, transfer molding or injection molding techniques.

Figure 7:
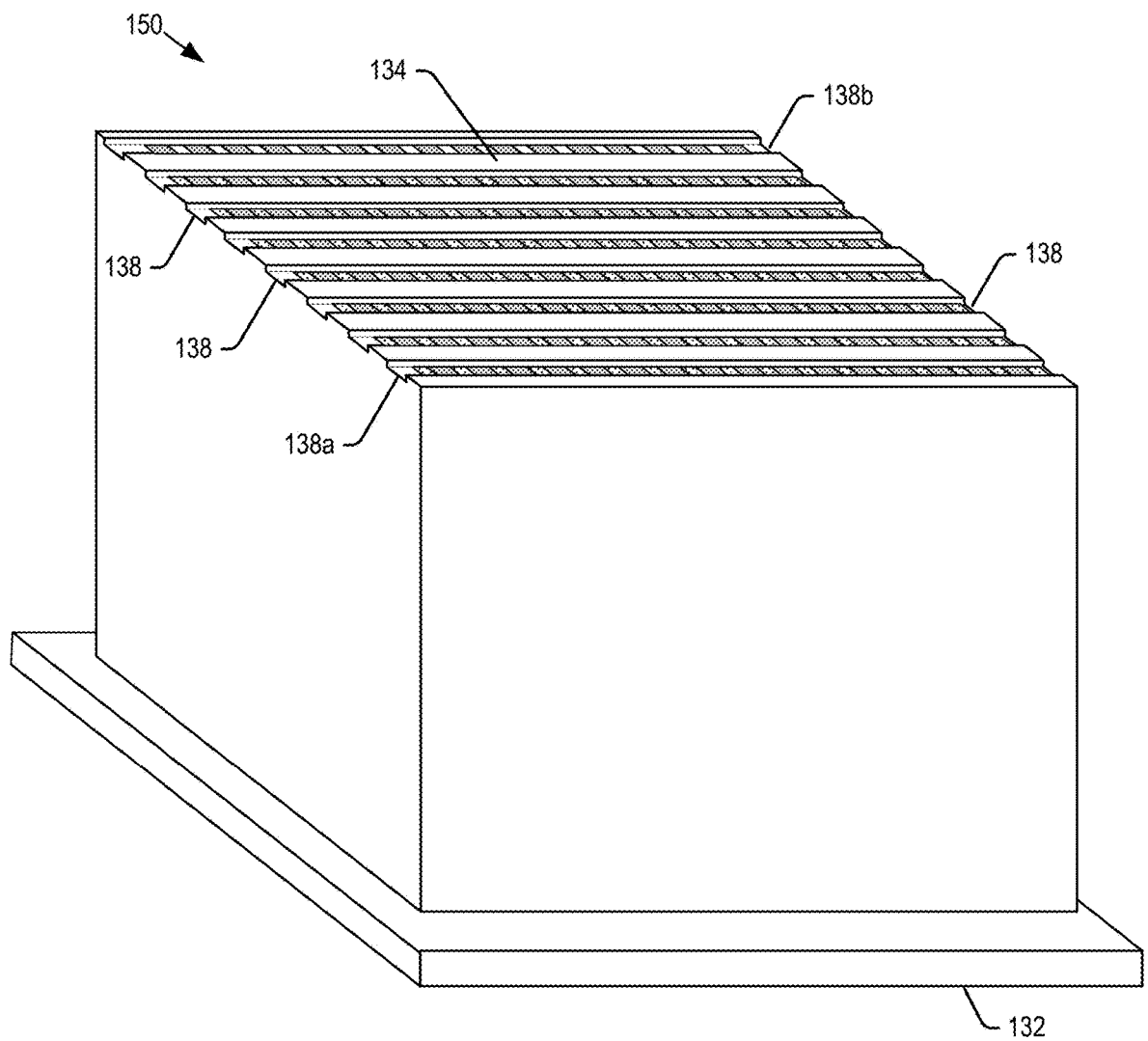
FIGS. 7 and 8 are perspective and edge views of a stack of semiconductor dies with side grooves formed in stack according to embodiments of the present technology.

Following encapsulation in step 222, side grooves may be formed in the reference surface 134 in step 226, as will now be explained with reference to the perspective view of FIG. 7, the cross-sectional edge view of FIG. 8, and the partial top cross-sectional view of FIG. 9. As shown, grooves 138 comprise a plurality of parallel grooves formed in reference surface 134, along the x-axis at front edges 106a (FIG. 4) of each of the dies 106 in the semiconductor device 150. The grooves 138 are made deep enough to expose a portion of each of the metal pillars 120 on each semiconductor die 106 in device 150. A single groove 138 exposes each of the pillars 120 on a single semiconductor die 106 in the semiconductor device 150. For example, one of the grooves, 138a, exposes all of the metal pillars 120 formed on the bottommost semiconductor die 106 in the die stack 130, as well as portions of the DAF 124 of the next upper adjacent semiconductor die. Another of the grooves, 138b, exposes all of the metal pillars 120 formed on the topmost semiconductor die 106 in the die stack 130, as well as portions of the mold compound around those metal pillars.

The grooves 138 may be formed by variety of methods, including for example by saw blade, by laser and/or by etching. FIG. 9 is a partial cross-sectional top view showing a sampling of metal pillars 120 and a depth of a groove (perpendicular to reference surface 134 in FIGS. 8 and 9) formed through the sampling of metal pillars 120. The depth of the grooves 138 may extend halfway through the diameter of the solder pillars, thus exposing the full diameter, d, of each solder pillar 120 in the groove as shown in FIG. 9. The depth of the grooves 138 may extend more or less than halfway through the diameter of the metal pillars 120 in further embodiments to expose less than the full diameter, d, of the metal pillars 120, with the provision that at least some portion of each metal pillar is exposed in a groove 138. As noted above, the pillars 120 may have other cross-sectional shapes in further embodiments.

The height of the grooves 138 (parallel to the reference surface 134 in FIG. 8) may be the same as the height of the solder pillars 120 above the surfaces of the dies 106, though the height of the grooves may be less than that in further embodiments. In embodiments, the grooves 138 are not formed through, and do not impact, the semiconductor dies 106 in the semiconductor device 150. The grooves 138 are formed into the reference surface 134 without visibility as to the positions of the dies 106 encapsulated within the device 150. Thus, the positions of the dies 106 are mapped along the z-axis before or during assembly so that the positions of the grooves 138 may be determined, and the grooves made, without cutting into the semiconductor dies 106 encapsulated within the device 150.

Figure 8:
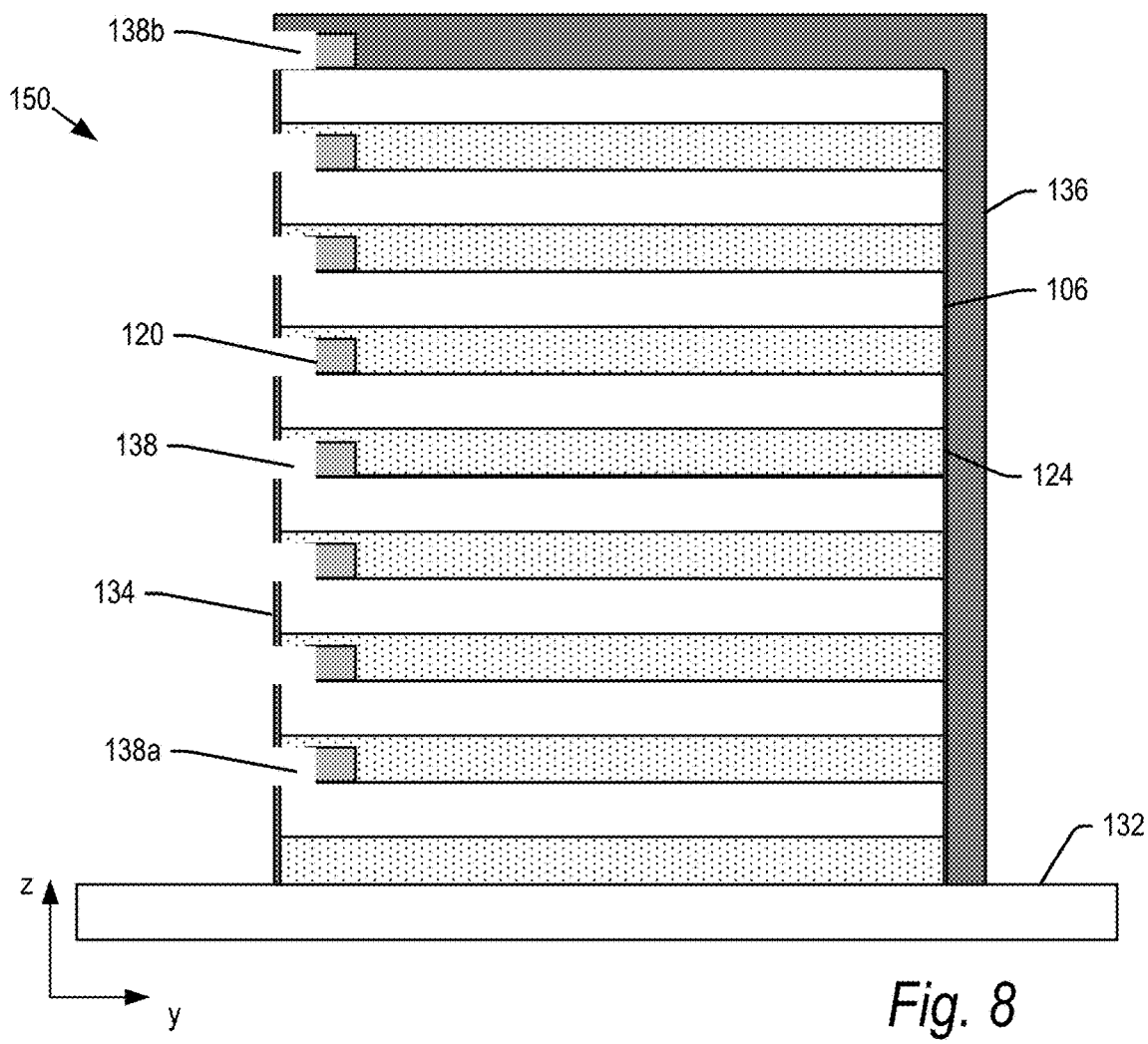
Figure 9:
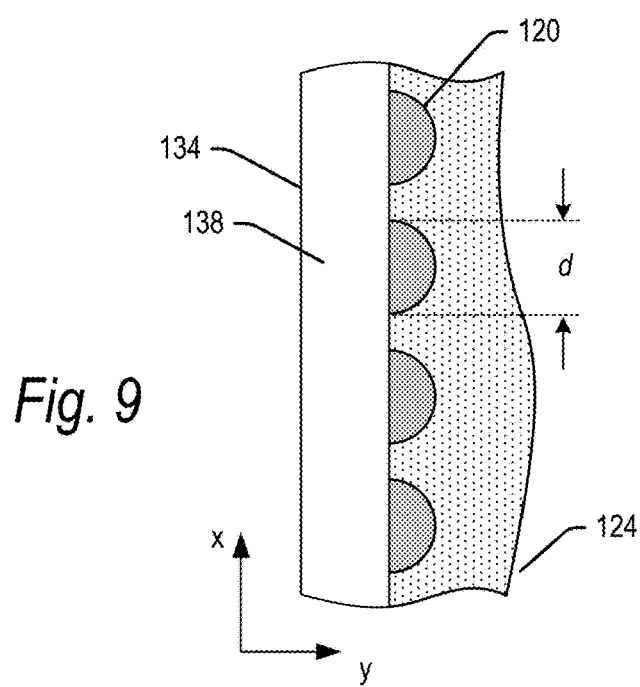
FIG. 9 is a partial cross-sectional top view of a portion of a stack of semiconductor dies with a side groove according to embodiments of the present technology.

In embodiments, the grooves 138 may be formed along the x-axis while the semiconductor device 150 is supported on carrier 132 with its reference surface 134 facing forward (in a vertical plane) as shown in FIG. 8. In further embodiments, the device may be rotated 90° and supported on carrier 132 (or another carrier), so that its reference surface 134 is facing upward (in a horizontal plane) as shown in FIG. 9. The grooves 138 may be formed with the device supported in other orientations in further embodiments.

Figure 10:
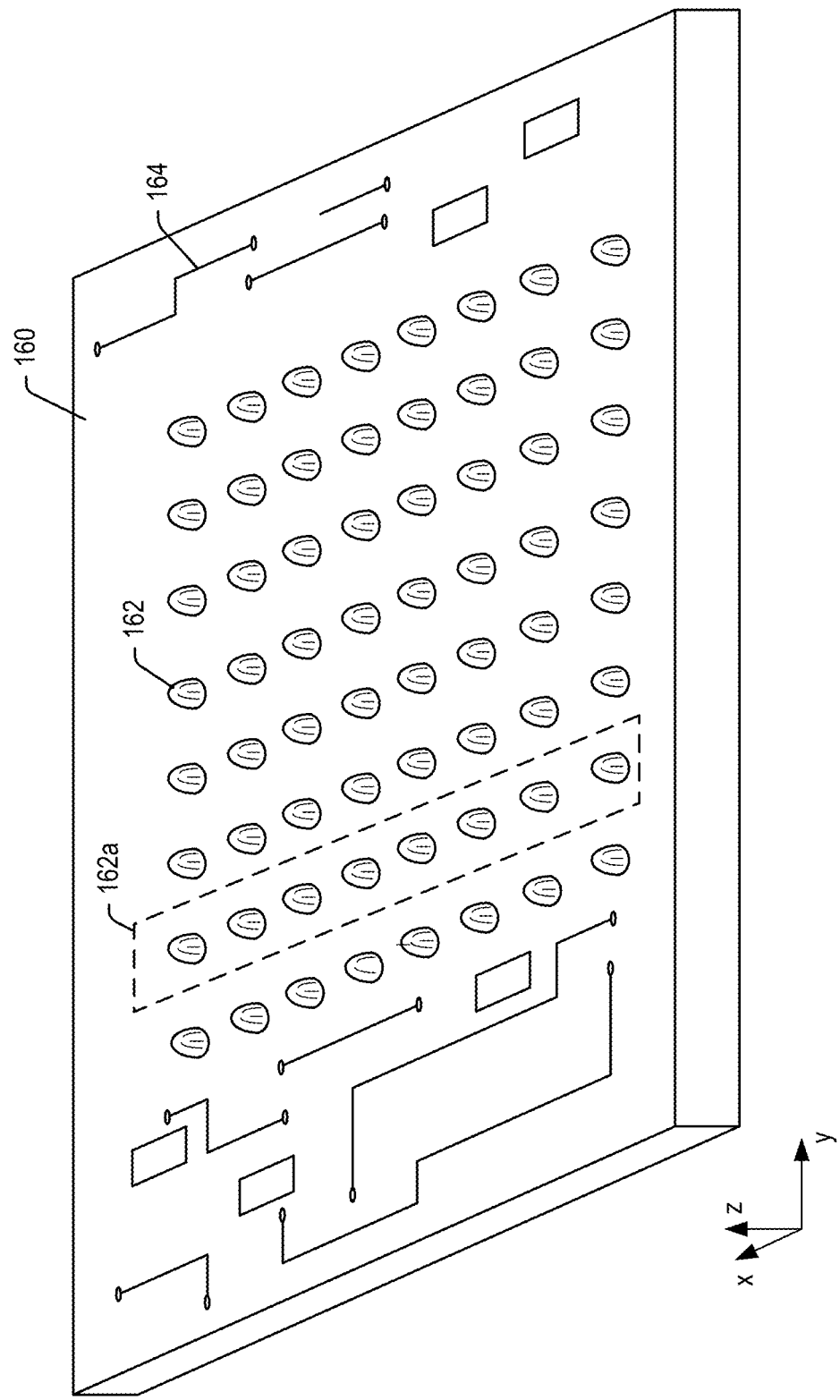
FIG. 10 is a perspective view of a printed circuit board on which the stack of semiconductor dies may be arranged according to embodiments of the present technology.

In embodiments, once the grooves 138 are formed in the semiconductor device 150, the carrier may be removed in step 230, and the device may be transferred onto a medium in step 232, such as PCB 160 shown in FIG. 10. The PCB 160 may for example be a high density interconnect (HDI) PCB. Other PCBs and other mediums such as substrates are possible in further embodiments. The PCB 160 may include a pattern of fine pitch solder balls 162. The pattern of solder balls is arranged in a number of rows (one row designated as 162a. In embodiments, there are at least as many rows 162a of solder balls (in the y-direction) as there are dies in the device 150. Within each row 162a, there are at least as many solder balls (in the x-direction) as there are exposed metal pillars 120 in the grooves 138 in the device 150. The solder balls 162 may be applied to the PCB 160 in the desired pattern using a variety of technologies, including for example stud bumping. The PCB 160 may further include electrical traces 164 for transferring signals and other voltages to/from the solder balls 162. The pattern of electrical traces 164 shown is by way of example only and may vary in further embodiments.

While solder balls are shown in FIG. 10, it is understood that solder paste or other conductive contacts extending above the surface of the PCB 160 may be used instead of solder balls in further embodiments. The conductive contacts may extend above a surface of the PCB 160 sufficiently to adhere to the exposed metal pillars 120 upon reflow of the conductive contacts as explained below.

Figure 11:
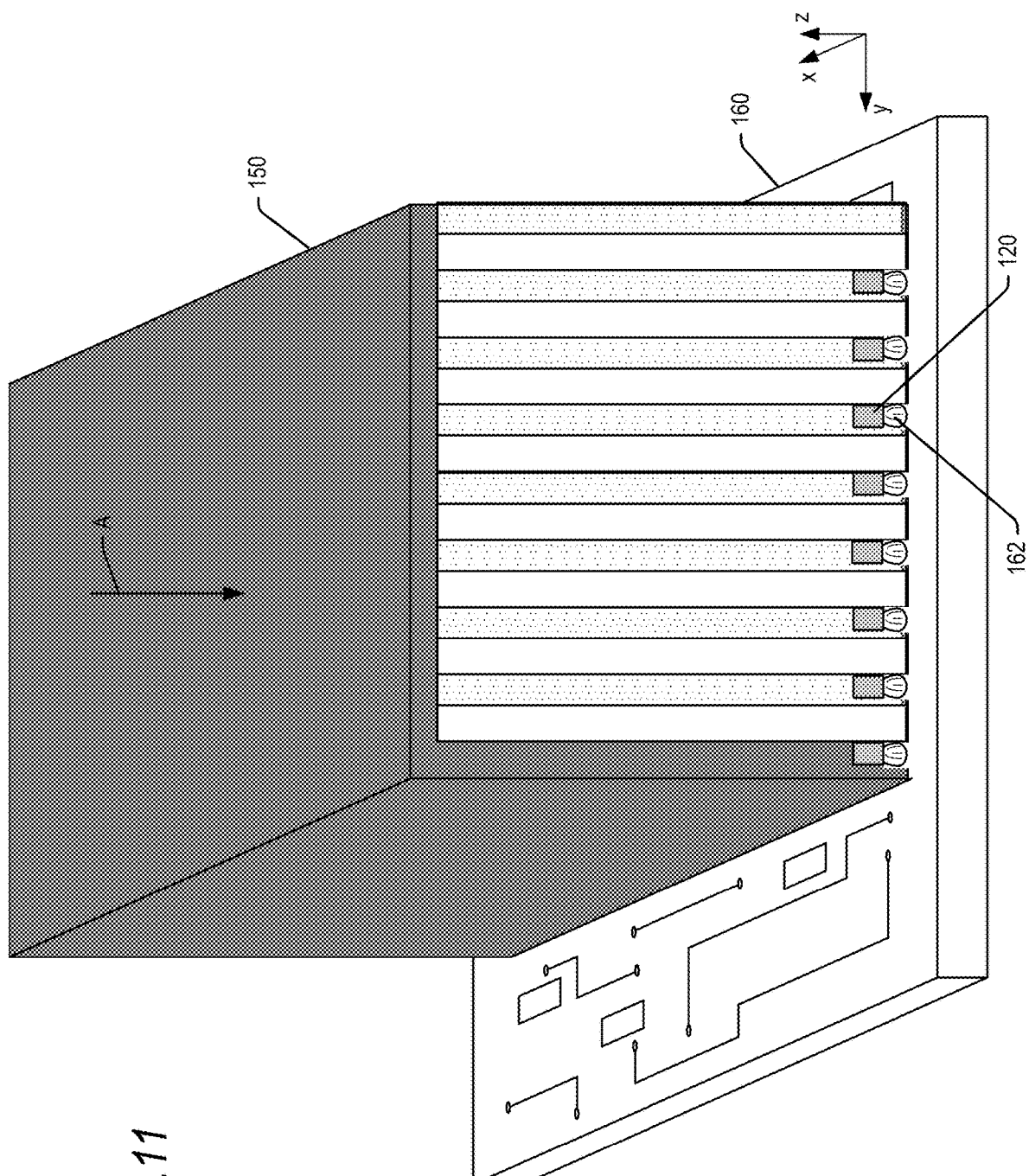
FIG. 11 is a perspective view of a printed circuit board and a cross-sectional view of a stack of semiconductor dies vertically arranged on the printed circuit board according to embodiments of the present technology.
Figure 12:
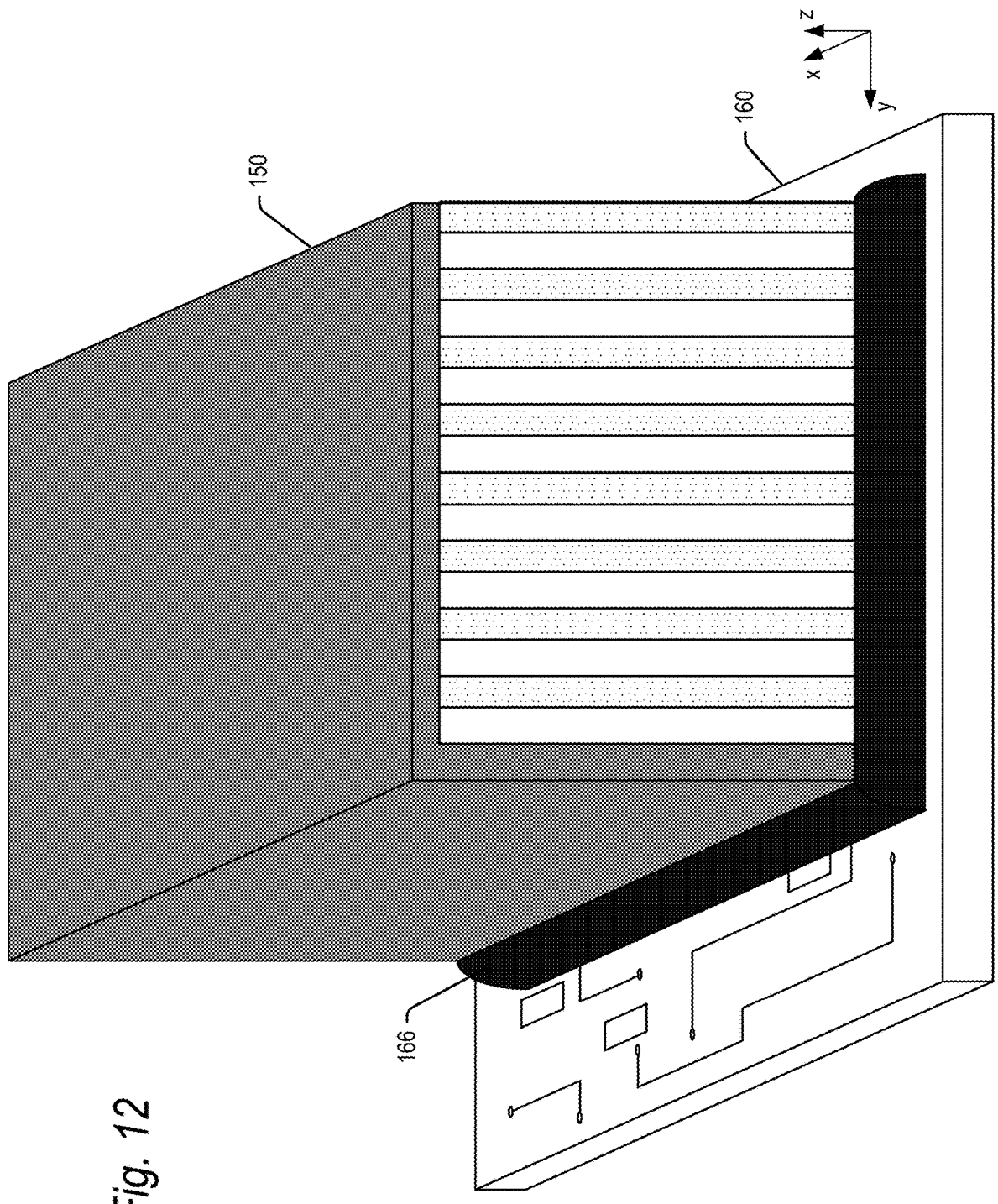
FIG. 12 is a perspective view of a printed circuit board and a cross-sectional view of a stack of semiconductor dies vertically arranged on the printed circuit board with a resin under-fill filling gaps in the stack of semiconductor die according to embodiments of the present technology.

The semiconductor device 150 may be surface mounted vertically on the PCB 160 in step 232 as shown in FIG. 11. That is, the device 150 may be rotated and the device may be surface mounted with the reference surface 134 resting against (or very close to) the PCB 160. The device 150 is rotated so that the sides shown oriented along the z-axis in FIG. 8 are reoriented to reside along the y-axis in FIG. 11. Similarly, the sides shown oriented along the y-axis in FIG. 8 are reoriented along the z-axis in FIG. 11.

As noted, the spacing between the rows 162a of solder balls 162 in the y-direction matches the spacing between the grooves 138 in the device 150. The solder balls may in fact fit within the grooves 138 when the device 150 is lowered onto the PCB 160 to properly position the device along the y-axis. As noted above, the spacing between each semiconductor die 106 in the device 150 may be 5 μm to 70 μm, though the spacing may be more or less than this in further embodiments.

The spacing between the solder balls 162 in each row 162a in the x-direction also matches the spacing between the metal pillars 120 on each die 106 in the device 150. As noted, the number of pillars 120, and the corresponding number of solder balls 162, is shown by way of example and there may be less or (likely) more pillars 120 and solder balls 162 in a row. Thus, once lowered onto the PCB and positioned, each pillar 120 on each die 106 in the semiconductor device 150 may align with and rest against a solder ball 162.

In the above-described embodiment, the semiconductor dies 106 are assembled into a stack 130, grooves 138 are formed, and then the device is mounted on the PCB 160. In further embodiments, the semiconductor dies 106 may be formed, and then the edge 106a of individual semiconductor dies 106 may be cut back or etched to expose metal pillars 120 at the edge. In a further embodiment, the wafer 100 may be diced so that the pillars 120 are exposed at the edge 106a after dicing. Thereafter, the dies may be stacked as described above. Alternatively, the dies 106 formed according to this embodiment may be mounted one at a time, vertically onto the PCB 160. That is, a first individual semiconductor die 106 may be placed vertically on the PCB 160, with its edge 106a against the PCB 160. A second semiconductor die 106 may then be stacked vertically against the first semiconductor die with its edge 106a on the PCB 160. And so on until all semiconductor dies in the stack 130 are vertically mounted on the PCB 160. The semiconductor dies 106 may also be assembled together in sub-blocks (e.g., in groups of 2, 4 or 8 dies), with sub-blocks being mounted in successive steps onto the PCB 160 until the full stack 130 is completed.

In step 236, the semiconductor device 150 and PCB 160 may be heated to reflow the solder balls against each of the metal pillars 120 to melt the solder balls against, and in good electrical contact with, each of the pillars 120. Surface adhesion and wicking will ensure a good contact with the solder balls against the pillars 120 as the solder balls melt, reflow and then harden against the pillars 120. However, in further embodiments, a support arm (not shown) may exert a light force against the device 150 in the direction of arrow A to support the stack 130 during reflow and to push the pillars 120 against the solder balls 162.

Fabrication of the semiconductor device 150 on the PCB 160 may be completed after the reflow process of step 226. However, in further embodiments, an epoxy or other resin or polymer 166 may be applied around the pillars 120 and solder balls 162, and injected into any spaces between the PCB 160 and semiconductor device 150, in an under-fill step 240. The polymer 166 may be applied as a liquid which then hardens into a solid layer. This under-fill step protects the electrical connections at each of the pillars 120, and further secures the semiconductor device 150 onto the PCB 160. Various polymers may be used as polymer 166, but in embodiments, it may be Hysol epoxy resin from Henkel Corp., having offices in California, USA.

After the under-fill step 240, the semiconductor device 150 on the PCB 160 may undergo final stage testing in a step 242. One such test may be a drop test, where the device 150 and PCB 160 are dropped from a height, and then tested for operation. Another such test may be a thermal cycling test where the device 150 and PCB 160 are cycled between a high temp (e.g., 85° C. or 125° C.) to a low temp (−40° C.) for up to 1000 times, and then tested for operation. Other tests may be performed. In the final stage testing, the under-fill polymer 166 may protect the device 150 against shock from the drop test, and stresses due to thermal mismatch between the dies 106 and PCB 160 during the thermal cycling test.

Similarly, the dies 106 may be tested at earlier stages in the fabrication process, before and/or after being assembled into the stack 130, and before and/or after reflow. If a semiconductor die is identified which is defective and non-functional, that die can be excluded from the operation of the semiconductor device 150 by system level programming of the semiconductor device 150.

The vertical semiconductor device 150 and PCB 160 may together comprise an electronic component that can be implemented in a host device. The vertical semiconductor device 150 according to the present technology provides several advantages. For example, it attaches to an array of solder balls on the PCB 160 in a manner analogous to a conventional horizontal flip chip. However, where conventional horizontal flip chips are able to affix only a single die to the array of solder balls, the vertical semiconductor device 150 is able to affix an entire stack of vertically-oriented semiconductor dies.

Additionally, the vertical semiconductor device 150 may be coupled directly to a PCB without requiring a substrate conventionally used to communicate signals between a PCB and semiconductor die. Moreover, the vertical semiconductor device 150 may be electrically coupled without using wire bonds. Wire bonds add additional costs and processing steps. Additionally, wire bonding to dies in a die stack limits the number of dies that can be provided in the stack, as performance issues such as noise, electrical shorting and parasitic RLC increase as the number of dies in the stack increase. In the present technology, each die in the block is affixed directly to the PCB, and dies may be added to the block without increasing any of the above-mentioned performance issues.

Moreover, the vertical semiconductor device 150 provides a large number of dies in a minimal overall form factor. The dies may be arranged in a block and coupled to the PCB without having to stagger the dies within the block, or provide a spacer layer between the dies, one of which configurations are otherwise needed to allow wire bond access to the bond pads. Staggering the dies, or spacing the dies with a spacer layer, increases the form factor of the semiconductor device. The vertical semiconductor device 150 according to the present technology has a minimal overall size, with the device having a form factor no greater than the dimensions of the encapsulated dies 106 and DAF 124 together. Additionally, each die in the block is supported against another die, thereby enabling the device to withstand mechanical shock and thermal stresses better than would individual semiconductor dies on a PCB or within a package.

In summary, an example of the present technology relates to a semiconductor device configured to mount to a medium, the semiconductor device comprising: a plurality of semiconductor dies, each semiconductor die comprising: a major surface, and metal pillars extending from the major surface, adjacent an edge of the semiconductor die; the plurality of semiconductor dies configured to surface mount to the medium with the edge of each semiconductor die facing the medium, the metal pillars configured to couple with electrical contacts on the medium.

In a further example, the present technology relates to a semiconductor device, comprising: a plurality of stacked semiconductor dies, each semiconductor die comprising: a first major surface having a length and a width, a second major surface having a length and a width corresponding to the length and the width of the first major surface, an edge extending between the first and second major surfaces, metal pillars formed on the first major surface adjacent the edge of the semiconductor die, and die attach film (DAF) on the second major surface for affixing the second major surface to another surface, the plurality of semiconductor dies stacked in a block, separated by the DAF; and grooves formed in a side of the block, the grooves exposing the metal pillars.

In another example, the present technology relates to a semiconductor device, comprising: a plurality of stacked semiconductor dies, each semiconductor die comprising: a first major surface having a length and a width, a second major surface having a length and a width corresponding to the length and the width of the first major surface, an edge extending between the first and second major surfaces, electrical conductor means extending from the first major surface adjacent the edge of the semiconductor die, the plurality of semiconductor dies stacked in a block; and grooves formed in a side of the block, the grooves exposing the electrical conductor means.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device configured to mount to a medium, the semiconductor device comprising:
a plurality of semiconductor dies, each semiconductor die comprising:
a first major surface and a second major surface,
a die attach film (DAF) on the first major surface, and
metal pillars extending from the second major surface, adjacent an edge of the semiconductor die, wherein the metal pillars on a first semiconductor die of the plurality of semiconductor dies are buried in the DAF of a second semiconductor die of the plurality of semiconductor dies next adjacent the first semiconductor die;
the plurality of semiconductor dies configured to surface mount to the medium with the edge of each semiconductor die facing the medium, the metal pillars configured to couple with electrical contacts on the medium.

2. The semiconductor device of claim 1, wherein the plurality of semiconductor dies are affixed to each other in a block, the metal pillars exposed in grooves formed in a surface of the block.

3. The semiconductor device of claim 2, wherein the grooves comprise a plurality of parallel grooves, a groove of the plurality of parallel grooves exposing the metal pillars of the first semiconductor die.

4. The semiconductor device of claim 3, wherein the groove further exposes a portion of the DAF affixed to the second semiconductor die next adjacent to the first semiconductor die.

5. The semiconductor device of claim 1, wherein the metal pillars comprise copper pillars.

6. The semiconductor device of claim 1, wherein the metal pillars comprise a single row of metal pillars adjacent the edge of each semiconductor die of the plurality of semiconductor dies.

7. The semiconductor device of claim 1, wherein the plurality of semiconductor die are stacked in a block, with each die separated from each other by the DAF.

8. A semiconductor device, comprising:
a plurality of stacked semiconductor dies, each semiconductor die comprising:
a first major surface having a length and a width,
a second major surface having a length and a width corresponding to the length and the width of the first major surface,
an edge extending between the first and second major surfaces,
metal pillars formed on the first major surface adjacent the edge of the semiconductor die, and
die attach film (DAF) on the second major surface for affixing the second major surface to another surface, the plurality of semiconductor dies stacked in a block, separated by the DAF;
grooves formed in a side of the block, the grooves exposing the metal pillars; and
molding compound encapsulating the plurality of semiconductor dies, at least one of the grooves formed through a surface of the molding compound.

9. The semiconductor device of claim 8, wherein the metal pillars are configured to couple with electrical contacts on a medium to electrically couple the device to the medium.

10. The semiconductor device of claim 8, wherein the metal pillars of a first semiconductor die of the plurality of semiconductor dies are buried within the DAF of a second semiconductor die of the plurality of semiconductor die next adjacent to the first semiconductor die.

11. The semiconductor device of claim 8, wherein the metal pillars exposed in a groove are interspersed with exposed portions of the DAF.

12. The semiconductor device of claim 8, wherein a groove exposes a portion of each metal pillar of a first semiconductor die of the plurality of semiconductor dies.

13. The semiconductor device of claim 12, wherein the groove further exposes portions of the DAF of a second semiconductor die of the plurality of semiconductor dies next adjacent to the first semiconductor die.

14. The semiconductor device of claim 8, wherein the groove is formed to a depth in the side of the block to expose a full diameter of the metal pillars.

15. The semiconductor device of claim 8, wherein the metal pillars are positioned within the grooves in the side of the block along two orthogonal axes to form a pattern of metal pillars.

16. The semiconductor device of claim 15, wherein the pattern of metal pillars is configured to match a pattern of electrical contacts on the medium.

17. A semiconductor device, comprising:
a plurality of stacked semiconductor dies, each semiconductor die comprising:
a first major surface having a length and a width,
a die attach film (DAF) on the first major surface,
a second major surface having a length and a width corresponding to the length and the width of the first major surface,
an edge extending between the first and second major surfaces,
electrical conductor means extending from the first major surface adjacent the edge of the semiconductor die and buried in the DAF on the first major surface, the plurality of semiconductor dies stacked in a block; and
grooves formed in a side of the block, the grooves exposing the electrical conductor means.

* * * * *